US009869730B2

(12) United States Patent
Oba et al.

(10) Patent No.: US 9,869,730 B2
(45) Date of Patent: Jan. 16, 2018

(54) MAGNETIC DETECTION APPARATUS

(71) Applicant: Mitsubishi Electric Corporation, Tokyo (JP)

(72) Inventors: Akihiro Oba, Tokyo (JP); Masahiro Yokotani, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 14 days.

(21) Appl. No.: 14/862,224

(22) Filed: Sep. 23, 2015

(65) Prior Publication Data
US 2016/0313410 A1    Oct. 27, 2016

(30) Foreign Application Priority Data

Apr. 23, 2015 (JP) .................. 2015-088157

(51) Int. Cl.
G01R 33/06 (2006.01)
G01B 7/14 (2006.01)
G01R 33/09 (2006.01)
G01D 5/14 (2006.01)
G01D 5/245 (2006.01)

(52) U.S. Cl.
CPC .......... *G01R 33/093* (2013.01); *G01D 5/147* (2013.01); *G01D 5/2451* (2013.01)

(58) Field of Classification Search
CPC ............................. G01R 33/093; G01D 5/16
USPC ........................... 324/207.21, 252
See application file for complete search history.

(56) References Cited

U.S. PATENT DOCUMENTS

| 7,397,236 B2 | 7/2008 | Tatenuma et al. |
| 9,175,942 B2* | 11/2015 | Watanabe ................ G01B 7/30 |
| 2004/0027712 A1 | 2/2004 | Yokotani et al. |
| 2014/0021941 A1* | 1/2014 | Van Veldhoven ..... B82Y 25/00 |
| | | 324/207.2 |

FOREIGN PATENT DOCUMENTS

| JP | 2004-69546 A | 3/2004 |
| JP | 4229877 B2 | 2/2009 |
| JP | 2014-35204 A | 2/2014 |

OTHER PUBLICATIONS

Communication dated Mar. 29, 2016 from the Japanese Patent Office in counterpart application No. 2015-088157.

* cited by examiner

*Primary Examiner* — Reena Aurora
(74) *Attorney, Agent, or Firm* — Sughrue Mion, PLLC; Richard C. Turner

(57) ABSTRACT

In a magnetic detection apparatus that prevents the output waveform from deviating regardless of whether two magneto-resistance elements are displaced relative to a magnet or accurately disposed relative to the magnet, the above two magneto-resistance elements are angled in consideration of a change in the direction of application of the magnetic field during displacement of the positional relationship and the anisotropy of the magneto-resistance elements so that the magneto-resistance elements are oriented in a direction in which the deviation of the output waveform caused by a change in the magnitude of application of the magnetic field during displacement of the positional relationship is cancelled, thereby preventing the detection accuracy of a magnetic moving body (detection target) being affected even if the magneto-resistance elements are displaced relative to the magnet due to manufacturing variations.

7 Claims, 10 Drawing Sheets

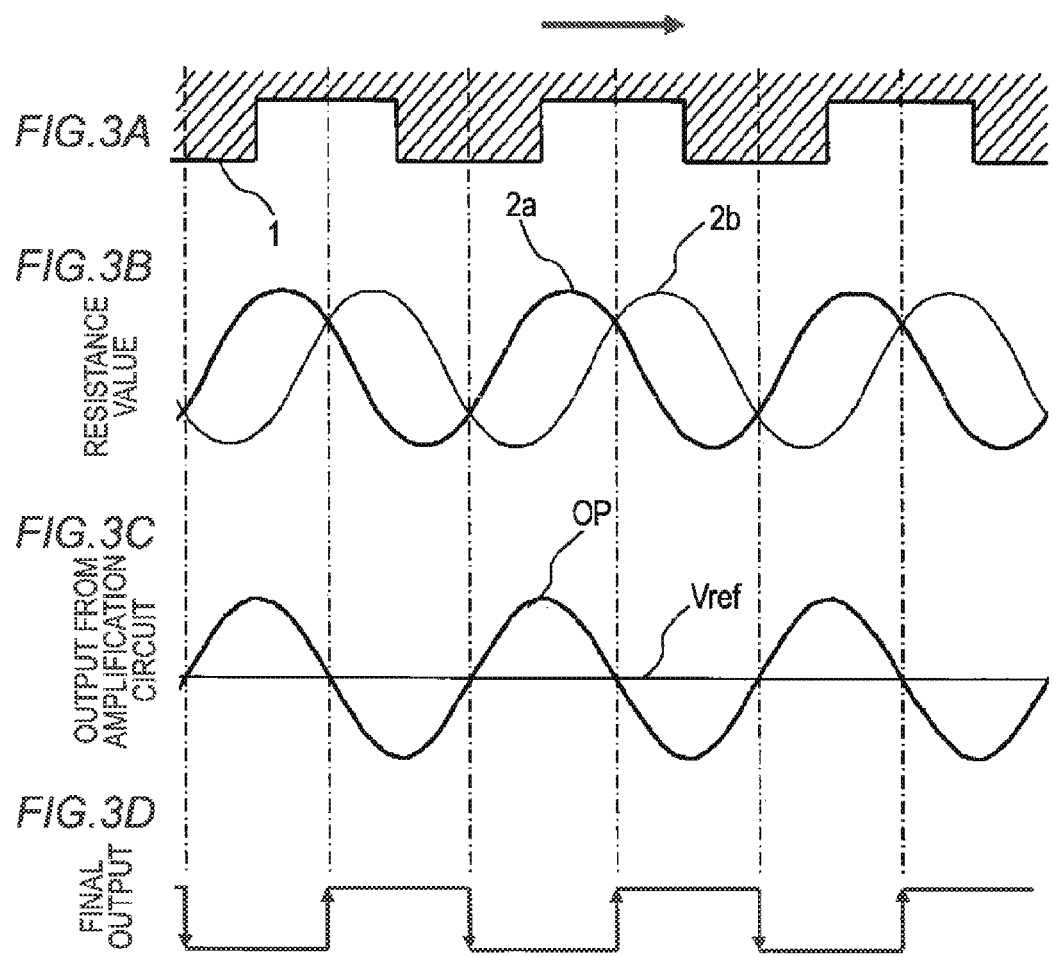

FIG.4A  FIG.4B
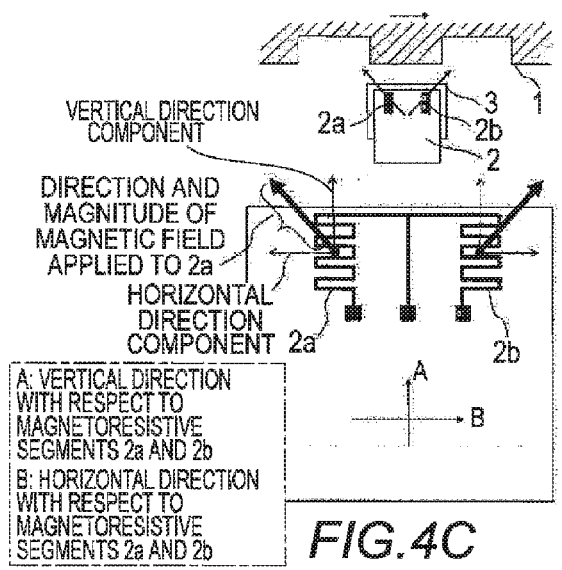
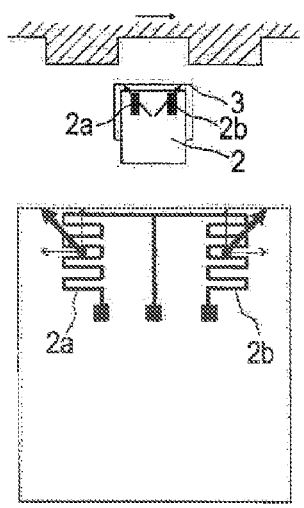
FIG.4C  FIG.4D
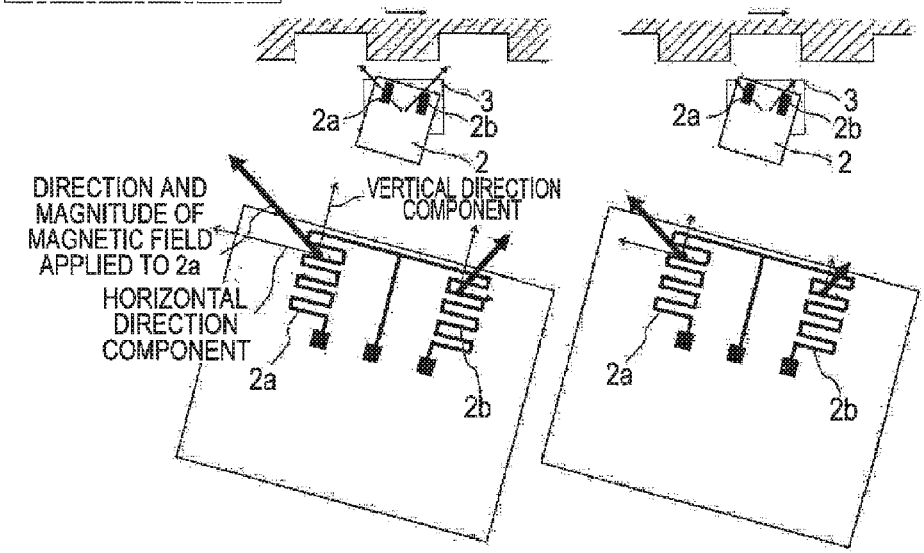

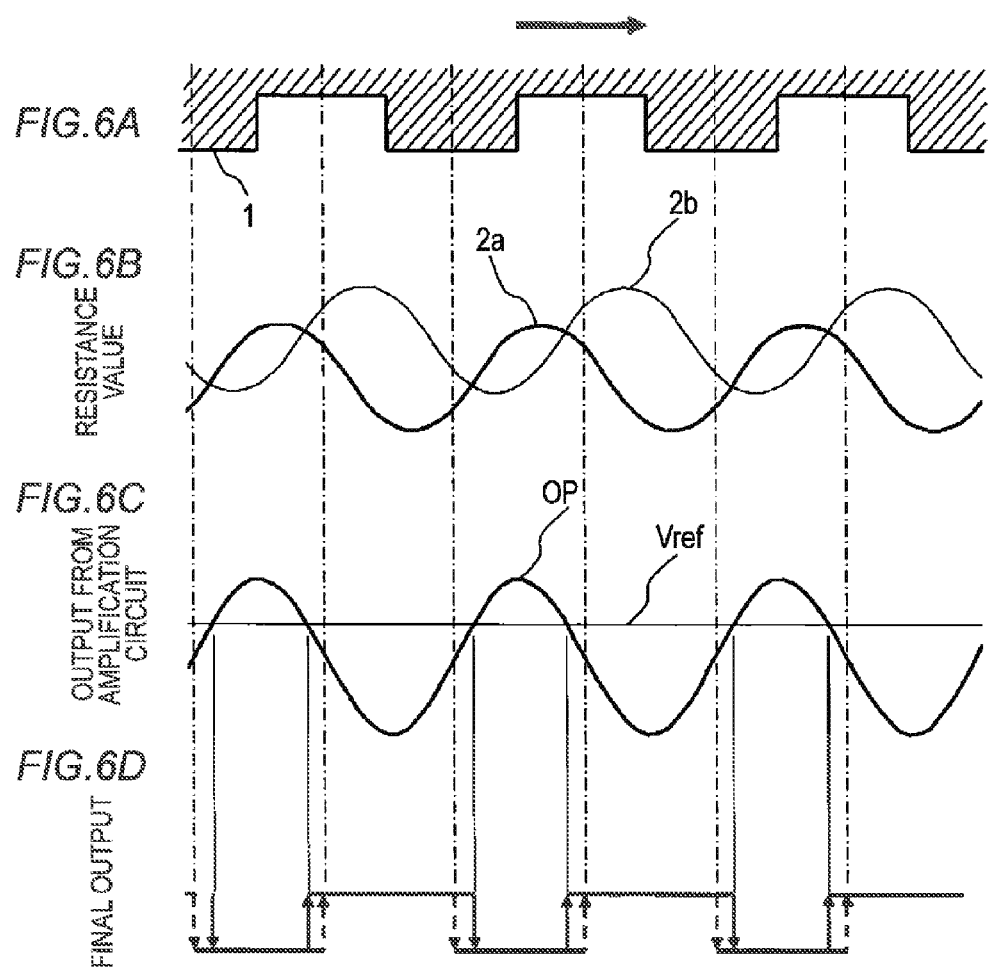

DIRECTION AND MAGNITUDE OF
MAGNETIC FIELD APPLIED TO 2a

ANGLE α

*FIG.8A*
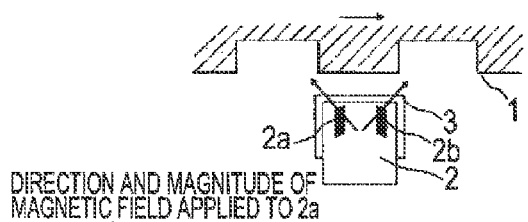
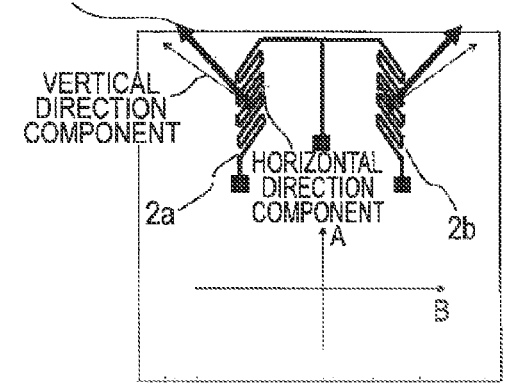
*FIG.8B*
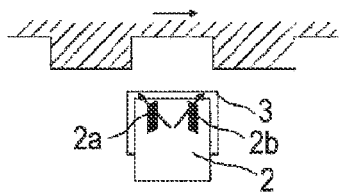
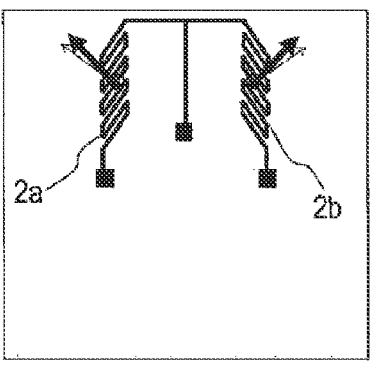
*FIG.8C*
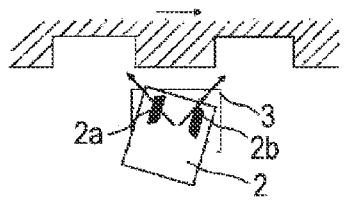
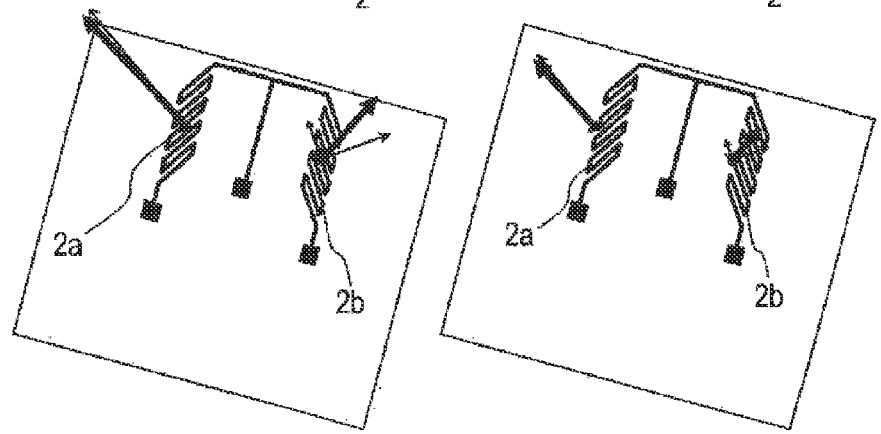
*FIG.8D*
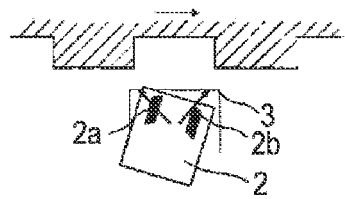
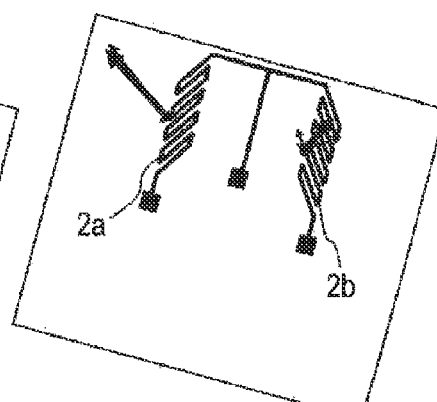

MAJOR LOOP

MAJOR LOOP

MAGNETIC DETECTION APPARATUS

BACKGROUND OF THE INVENTION

1. Field of the Invention

The present invention relates to a magnetic detection apparatus including a giant magneto-resistance element (referred below as a GMR element), which is an electromagnetic conversion element.

2. Description of the Related Art

A GMR element is a so-called artificial lattice film, which is a laminated body in which a magnetic layer and a non-magnetic layer with a thickness of several angstroms to several tens of angstroms are alternately laminated; (Fe/Cr)n, (permalloy/Cu/Co/Cu)n, and (Co/Cu)n are known (n represents the number of layers).

Recently, an in-vehicle rotation sensor or the like has adopted a magnetic detection system that detects changes in a magnetic field acting on magneto-resistance elements by forming an electrode at each terminal of magneto-resistance segments including GMR elements as described above to configure a bridge circuit, connecting a constant voltage and constant current power source between two opposed electrodes of the bridge circuit, and converting changes in the resistance values of the magneto-resistance segments to changes in voltage.

JP-A-2004-69546 discloses such a conventional magnetic detection apparatus, which will be described below with reference to FIGS. 1A through 1C. FIG. 1A is a perspective view, FIG. 1B is a plan view, and FIG. 1C is an enlarged view of magneto-resistance segments.

In FIG. 1A through 1C, reference numeral 1 indicates a magnetic moving body such as, for example, a gear having projections around a disc and a shape for changing a magnetic field; 2 indicates a processing circuit unit having a board surface on which a circuit is printed; 2a and 2b indicate magneto-resistance segments; 3 indicates a magnet; and reference numeral 4 indicates the rotary shaft of the magnetic moving body 1. The magnetic moving body 1 rotates synchronously when the rotary shaft 4 rotates. Each of magneto-resistance segments 2a and 2b is indicated as a black block in FIGS. 1A and 1B while an enlarged view of the shape (pattern) of the magneto-resistance segment is indicated in FIG. 1C.

FIG. 2 shows the configuration of a processing circuit unit 2 of the conventional magnetic detection apparatus described above. In FIG. 2, the processing circuit unit 2 includes a Wheatstone bridge circuit 11 having the two magneto-resistance segments (GMR elements) 2a and 2b, a differential amplification circuit 12, a comparator circuit 13, and an output circuit 14. Reference numeral 151 indicates a transistor, reference numeral 152 indicates an output terminal, VCC indicates a constant voltage, and Vref indicates a reference voltage.

In FIG. 2, the constant voltage VCC is applied to a bridge circuit including the magneto-resistance segments 2a and 2b and fixed resistors 2c and 2d to convert changes in the resistance values of the magneto-resistance segments 2a and 2b caused by changes in a magnetic field to changes in voltage. A signal indicating voltage changes is amplified by a differential amplification circuit 12 and input to a comparator circuit 13. The signal is compared with the reference voltage Vref by the comparator circuit 13, converted to the final output 0 or 1 (VCC) by a transistor 151 of an output circuit 14, and then output from an output terminal 152.

Next, the operation of the conventional magnetic detection apparatus will be described with reference to FIGS. 3A through 3D which are a timing chart showing the operation of the conventional magnetic detection apparatus. FIG. 3A shows the disposition of a magnetic moving body 1, FIG. 3B shows the resistance values of the magneto-resistance segments 2a and 2b, FIG. 3C shows the output from the differential amplification circuit 12, and FIG. 3D shows the final output.

When the magnetic moving body 1 shown in FIG. 1A rotates about the rotary shaft 4, the magnetic fields applied to the magneto-resistance segments 2a and 2b is changed to cause resistance changes according to the magnetic fields applied to the magneto-resistance segments 2a and 2b corresponding to the shape of the magnetic moving body 1 as shown in FIGS. 3A and 3B.

In addition, as shown in FIG. 3C, an output from the differential amplification circuit 12 is obtained due to changes in the above resistance values. Then, as shown in FIG. 3D, the comparator circuit 13 shapes the waveform of the output from the differential amplification circuit 12 and the final output signal 1 or 0 corresponding to the shape of the magnetic moving body 1 is output.

However, there is a need for improvement of detection accuracy in a magnetic detection apparatus as described above, but the accuracy for detecting the positions of projections and depressions of the magnetic moving body 1 is limited by variations on manufacturing in the relative positions of the magneto-resistance segments 2a and 2b and a magnet 3.

FIGS. 4A through 4D schematically show a case in which the magneto-resistance segments 2a and 2b are accurately disposed relative to the magnet 3 and a case in which the magneto-resistance segments 2a and 2b are displaced in the rotation direction relative to the magnet 3. FIGS. 4A and 4B shows an example of the magnetic detection apparatus accurately disposed. FIG. 4A indicates a case in which the magnetic moving body 1 is close to the magneto-resistance segments 2a and 2b and FIG. 4B indicates a case in which the magnetic moving body 1 is away from the magneto-resistance segments 2a and 2b. In both cases, the directions the vertical direction component and the horizontal direction component) of the magnetic fields applied to the magneto-resistance segments 2a and 2b are the same and the magnitudes of the magnetic fields are also the same.

However, as shown in FIGS. 4C and 4D, when the magneto-resistance segments 2a and 2b are displaced in the rotation direction relative to the magnet 3, the in-plane magnetic field applied to the magneto-resistance segments 2a and 2b becomes uneven and the direction and the magnitude of the magnetic field become different.

As for the magnitude of the magnetic field, the magneto-resistance segments 2a and 2b have different distances from the center of the AB plane of the magnet 3. The in-plane magnetic field at the center of the AB plane of the magnet 3 is zero and the in-plane magnetic field becomes larger as the distance from the center of the AB plane increases. Accordingly, in FIGS. 4C and 4D, the magnitude of the in-plane magnetic field of the segment 2a is larger than the magnitude of the in-plane magnetic field of the segment 2b.

As for the direction of the magnetic field, the horizontal direction component is larger in the magnetic field applied to the magneto-resistance segment 2a while the vertical direction component is larger in the magnetic field applied to the magneto-resistance segment 2b. Accordingly, the magnetic fields applied to the magneto-resistance segments 2a and 2b become uneven between the horizontal direction and the vertical direction.

Here, the characteristics of the applied magnetic field and changes in the resistance value of a GMR element (magneto-resistance element) will be described. The GMR element has significantly greater MR effects (MR change ratio) than a magneto-resistance element (MR element). In addition, the GMR element depends only on the relative angle of the orientation of magnetization of the adjacent magnetic layers, so the GMR element is an in-plane magnetic sensing element that makes the same changes in the resistance value regardless of the angle difference between the orientation of an external magnetic field and the current.

FIGS. 5A and 5B show the relationship between the strength of the magnetic field applied to a GMR element and the resistance value of the GMR element. FIG. 5A shows a case in which the magneto-resistance segments 2a and 2b are accurately disposed relative to the magnet 3 as in FIGS. 4A and 4B and FIG. 5B shows a case in which the magneto-resistance segments 2a and 2b are displaced relative to the magnet 3.

When the in-plane magnetic field is applied to the GMR element, the resistance value of the GMR element becomes different between the vertical direction (an arrow A in FIG. 4A) and the horizontal direction (an arrow B in FIG. 4A) with respect to the shape (pattern) of the GMR element. This is referred to as an anisotropy. In FIGS. 5A and 5B, the thick line indicates the horizontal magnetic field applied to the GMR pattern and the thin line indicates the vertical magnetic field applied to the GMR pattern.

The arrows in FIG. 5A indicate the ranges of the resistance value and the magnetic field of a GMR element when the in-plane magnetic field in FIGS. 4A and 4B is even. FIG. 5A shows that presence in the middle of the vertical magnetic field and the horizontal magnetic field and the magnitude of the applied magnetic field is the same in both cases. In addition, the arrows in FIG. 5B indicate the ranges of the magnetic field and the resistance value of the GMR element when the in-plane magnetic field in FIGS. 4C and 4D is uneven. The horizontal magnetic field is larger in the magneto-resistance segment 2a and the vertical magnetic field is larger in the magneto-resistance segment 2b. The magnitude of the applied magnetic field in the magneto-resistance segment 2a is larger than the magnitude of the applied magnetic field in the magneto-resistance segment 2b. Accordingly, when the in-plane magnetic field is uneven as shown in FIG. 5B, the range of changes in the resistance value is different between the magneto-resistance segment 2a and the magneto-resistance segment 2b. That is, the range of changes in the resistance value of the magneto-resistance segment 2a is lower than that of the magneto-resistance segment 2b.

Referring to FIGS. 6A through 6D, the operation of the magnetic detection apparatus when the magneto-resistance segments 2a and 2b are displaced relative to the magnet 3 will be described. FIG. 6A shows the disposition of the magnetic moving body 1, FIG. 6B shows the resistance values of the magneto-resistance segments 2a and 2b, FIG. 6C shows the output from the differential amplification circuit 12, and FIG. 6D shows the final output.

As shown in FIGS. 6C and 6D, there are differences in changes in the resistance value of the GMR element and the output waveform of the differential amplification circuit 12 shifts in one direction. Since the electric potential value of the comparator circuit 13 does not change, the position of the output signal is displaced as compared with the case (arrow with a dotted line) in which the magneto-resistance segments 2a and 2b are not displaced relative to the magnet 3, significantly degrading the detection accuracy.

SUMMARY OF THE INVENTION

The invention has been devised to address the above problems with an object of providing a magnetic detection apparatus that does not affect the detection accuracy of the magnetic moving body (detection target) even if the magneto-resistance elements are displaced relative to the magnet due to manufacturing variations.

A magnetic detection apparatus according to the invention includes a magnetic moving body having a shape changing a magnetic field, the magnetic moving body rotating in sync with a rotary shaft, a magneto-resistance element detecting a change in the magnetic field by the magnetic moving body, the magneto-resistance element being anisotropic, a magnet applying the magnetic field to the magneto-resistance element, and a processing circuit unit having abridge circuit including the at least two magneto-resistance elements, the processing circuit unit detecting the change in the magnetic field acting on the magneto-resistance elements by converting a change in resistance values of the magneto-resistance elements to a change in voltages. The at least two magneto-resistance elements are separately disposed in a rotational direction of the magnetic moving body and, when a magnitude of the magnetic field applied to the magneto-resistance element changes due to displacement of the at least two magneto-resistance elements in the rotational direction relative to the magnet, a pattern shape of the magneto-resistance element is angled so as to cancel an amount of a change in a resistance value of the magneto-resistance element caused by the change in the magnitude of the magnetic field by changing a direction of the magnetic field applied.

In the magnetic detection apparatus according to the invention, changes in the resistance values of at least two magneto-resistance elements can be cancelled by angling the pattern shapes of the magneto-resistance elements. Accordingly, manufacturing variations in the detection accuracy of a rotary moving body can be reduced.

The foregoing and other object, features, aspects, and advantages of the present invention will become more apparent from the following detailed description of the present invention when taken in conjunction with the accompanying drawings.

BRIEF DESCRIPTION OF THE DRAWINGS

FIG. 1A is a perspective view, FIG. 1B is a plan view, and FIG. 1C is an enlarged view of magneto-resistance segments.

FIGS. 3A through 3D are a timing chart showing the operation of the conventional magnetic detection apparatus.

FIGS. 4A through 4D show the conventional magnetic detection apparatus, FIGS. 4A and 4B show a case in which the magneto-resistance segments are accurately disposed relative to a magnet, and FIGS. 4C and 4D show a case in which the magneto-resistance segments are displaced relative to the magnet.

FIGS. 6A through 6D are a timing chart showing the operation of the conventional magnetic detection apparatus in which individual structures are displaced.

FIG. 7A is a perspective view, FIG. 7B is a plan view, and FIG. 7C is an enlarged view of a magneto-resistance segment.

FIGS. 8A through 8D show the magnetic detection apparatus according to embodiment 1 of the invention, FIGS. 8A and 8B show a case in which the magneto-resistance segment is accurately disposed relative to a magnet, and FIGS. 8C and 8D show a case in which the magneto-resistance segment is displaced relative to the magnet.

DESCRIPTION OF THE PREFERRED EMBODIMENTS

Embodiment 1

Figure 7A:
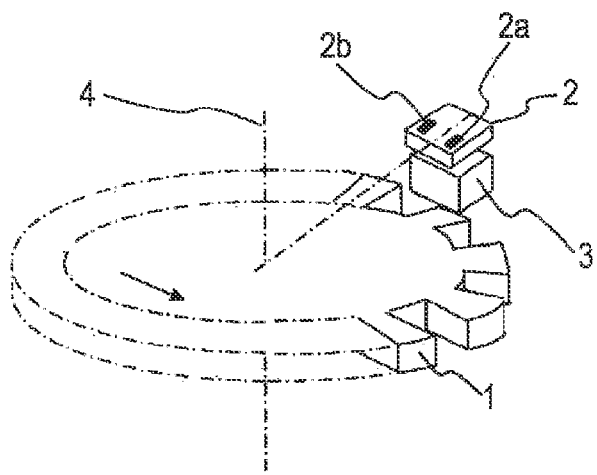
FIGS. 7A through 7C show the structure of a magnetic detection apparatus according to embodiment 1 of the invention.
Figure 7B:
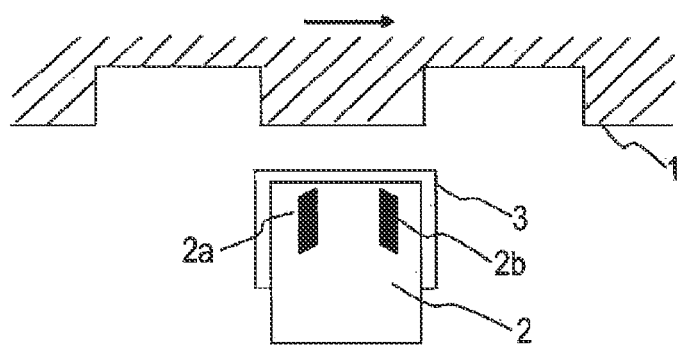
Figure 7C:
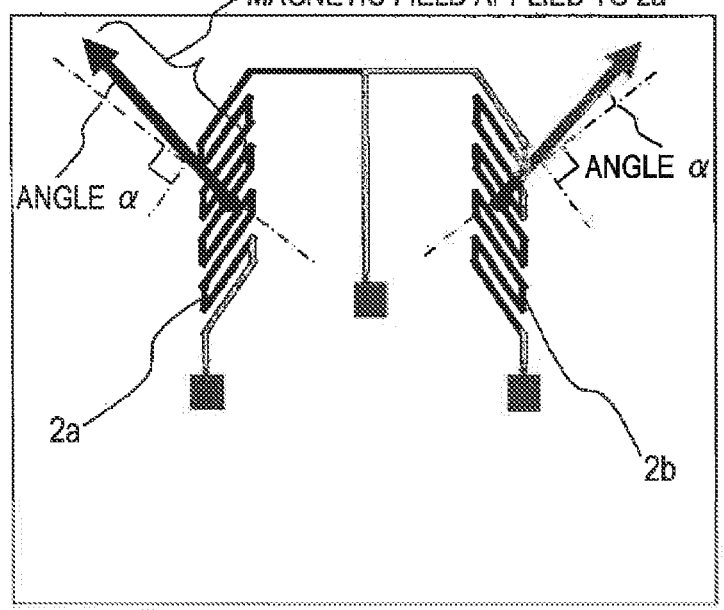

A magnetic detection apparatus according to embodiment 1 of the invention will be described with reference to the drawings FIG. 7A through 7D show the structure of the magnetic detection apparatus according to embodiment 1 of the invention. FIG. 7A is a perspective view, FIG. 7B is a plan view, and FIG. 7C is an enlarged view of a magneto-resistance segment.

In the drawing, reference numeral 1 indicates a magnetic moving body in which projecting shapes for changing a magnetic field are provided around, for example, a disc; 2 indicates a processing circuit unit having a board surface on which a circuit is printed; 2a and 2b indicate magneto-resistance segments; 3 indicates a magnet, and 4 indicates the rotary shaft of the magnetic moving body 1.

The magnetic moving body 1 rotates synchronously when the rotary shaft 4 rotates. Each of the magneto-resistance segments 2a and 2b is represented as a black block in FIG. 7B because the magneto-resistance segments 2a and 2b are close to each other and cannot be represented individually. FIG. 7C is an enlarged view of the magneto-resistance segments, in which the shape of each magneto-resistance segment is represented as a zigzag shape angled at an angle α relative to a direction orthogonal to the direction of the magnetic field applied.

Since the angle α depends on the displacement in the rotational direction of the magneto-resistance elements relative to the magnet, the angle α is optimized by measurement. In addition, since the directions of the magnetic fields applied to the magneto-resistance segments 2a and 2b are symmetric with respect to a line, the shapes of the magneto-resistance segments 2a and 2b are also symmetric with respect to a line. Basically, the pattern of an anisotropic magneto-resistance element generally has a zigzag shape as shown in the drawing to increase the resistance value to some extent by extending the distance and to ensure stable operation with small hysteresis by application in the vertical direction.

Although the magneto-resistance segments 2a and 2b and the processing circuit unit 2 are provided on the same board in FIG. 7, these components may be provided on separate boards.

FIGS. 8A through 8D schematically show changes in the magnetic field that simulate manufacturing variations. FIGS. 8A and 8B shows an example of a magnetic detection apparatus manufactured accurately. The in-plane magnetic fields applied to the magneto-resistance segments 2a and 2b are even regardless of whether the magnetic moving body 1 is close (FIG. 8A) or away from (FIG. 8B) the magneto-resistance segments 2a and 2b. That is, the vertical magnetic field and the horizontal magnetic field and their magnitudes are even.

However, when the magneto-resistance segments 2a and 2b are displaced relative to the magnet 3 due to manufacturing variations in the rotation direction as shown in FIGS. 8C and 8D, the in-plane magnetic fields applied to the magneto-resistance segments 2a and 2b have different magnitudes and directions.

In the magneto-resistance segment shape in embodiment 1, the magnitude of the applied magnetic field becomes larger and the vertical magnetic field becomes larger due to displacement in the magneto-resistance segment 2a than in the case of accurate manufacturing.

In the magneto-resistance segment 2b, the magnitude becomes smaller and the vertical magnetic field becomes smaller than in the case of accurate manufacturing.

Figure 9A:
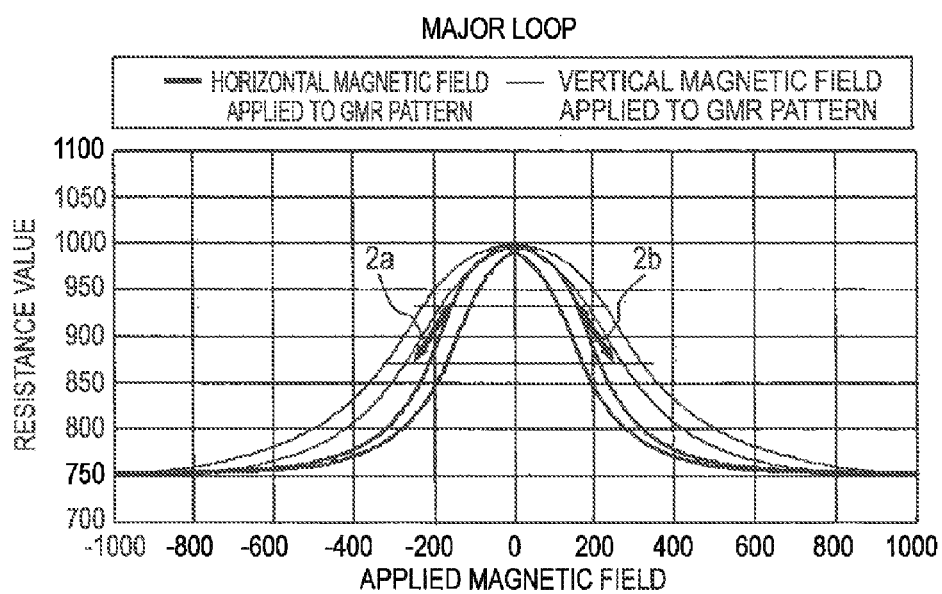
FIGS. 9A and 9B show the relationship between the strength of the magnetic field and the resistance value of a GMR element according to embodiment 1 of the invention.
Figure 9B:
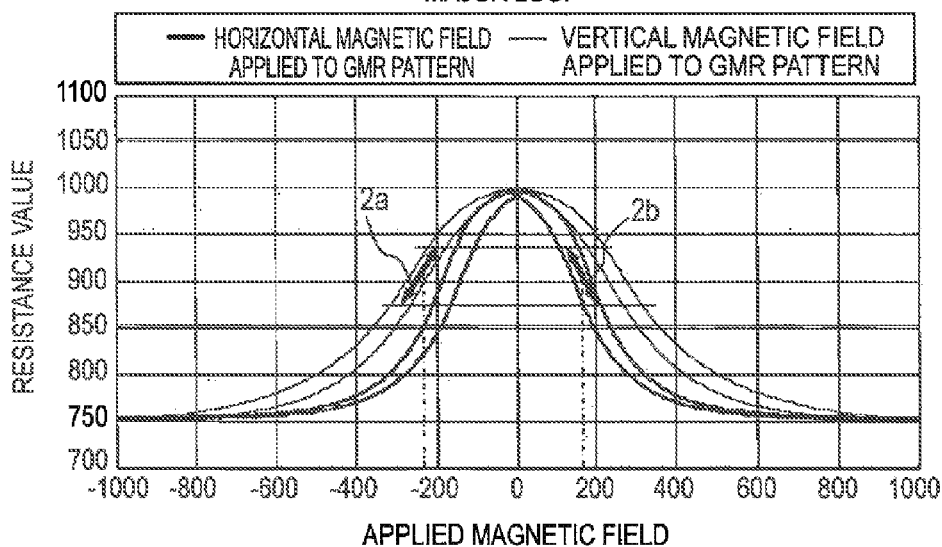

FIGS. 9A and 9B show the relationship between the strength of the magnetic field of the GMR element and the resistance value of the GMR element. FIG. 9A shows a case in which the magneto-resistance segments 2a and 2b are accurately disposed relative to the magnet 3 as in FIGS. 8A and 8B. FIG. 9B shows a case in which the magneto-resistance segments 2a and 2b are displaced relative to the magnet 3 as in FIGS. 8C and 8D. Changes in the resistance value of the GMR element in a case in which the magneto-resistance segments 2a and 2b are displaced as in FIGS. 8C and 8D will be described with reference to FIG. 9B.

Figure 1A:
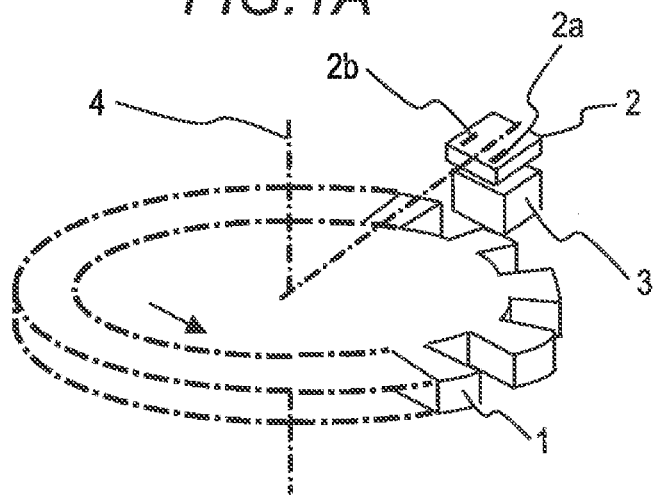
FIGS. 1A through 1C show the structure of a conventional magnetic detection apparatus.
Figure 1B:
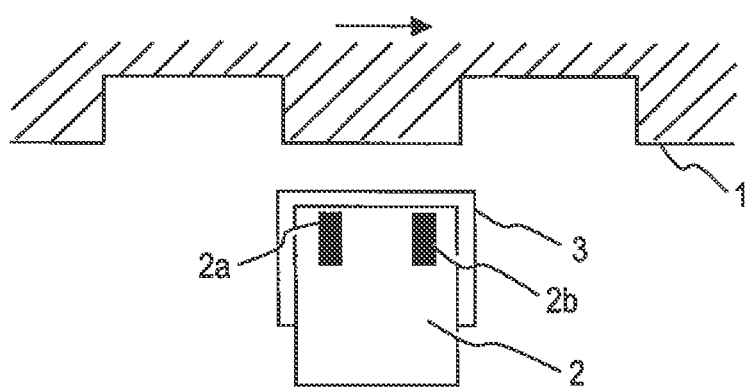
Figure 1C:
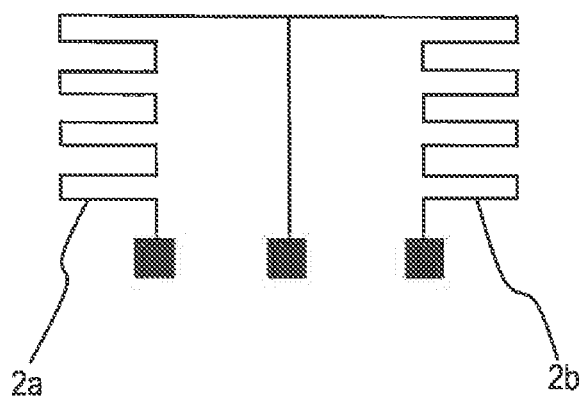
Figure 2:
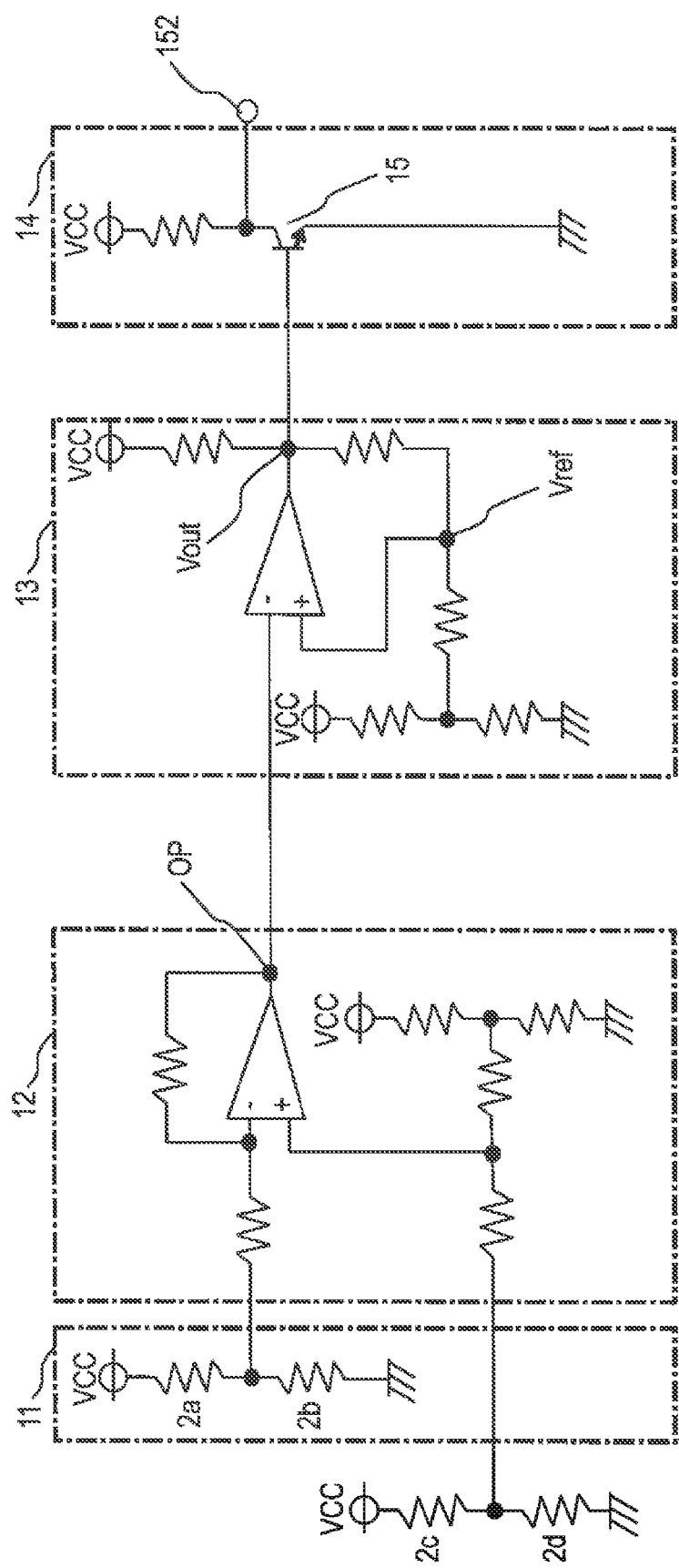
FIG. 2 shows the configuration of a processing circuit unit of the conventional magnetic detection apparatus.
Figure 5A:
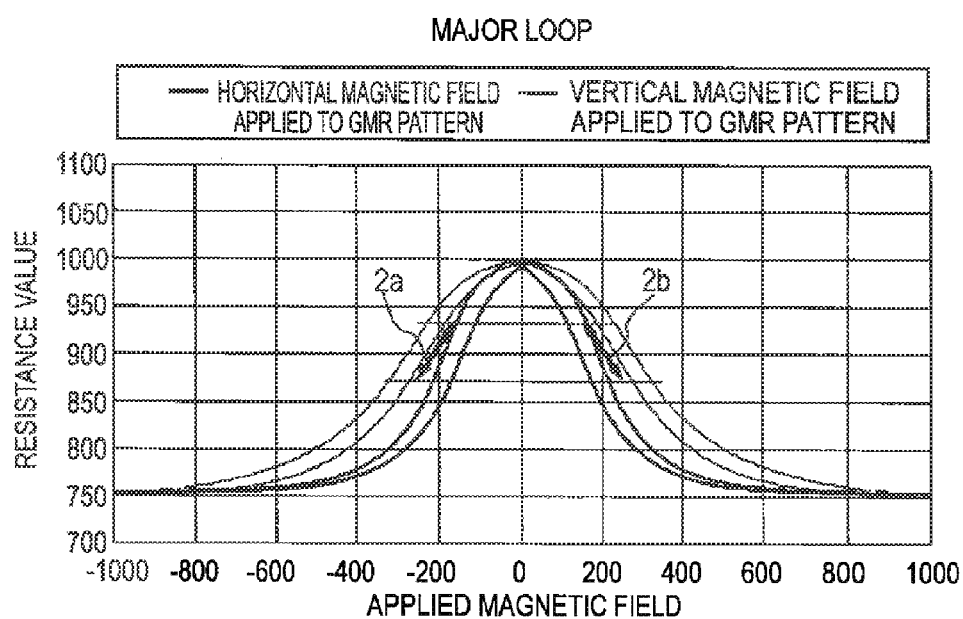
FIGS. 5A and 5B show the relationship between the strength of the magnetic field and the resistance value of a GMR element.
Figure 5B:
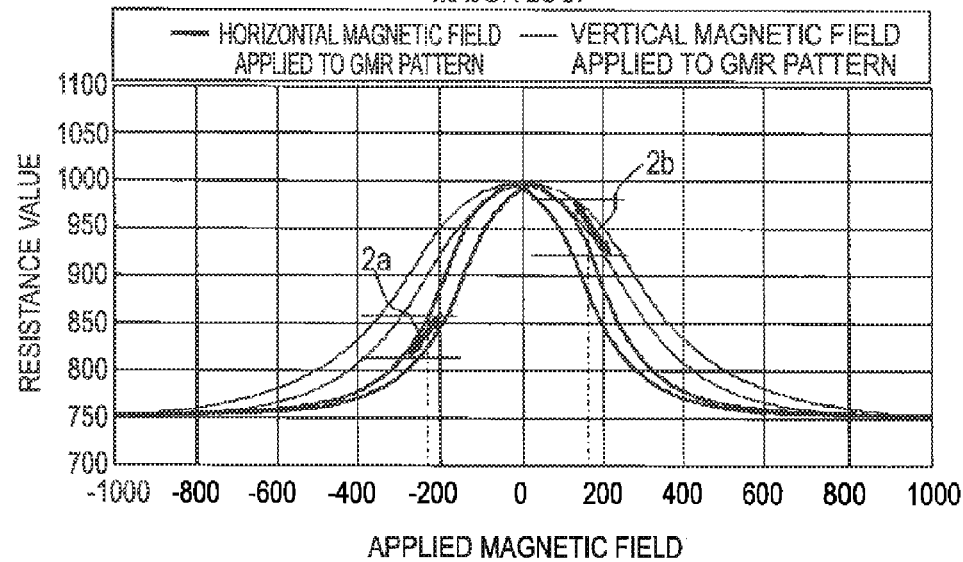

In the magneto-resistance segment 2a according to embodiment 1, the magnitude of the applied magnetic field changes so as to increase. If the direction of the applied magnetic field does not change at this time, the resistance value reduces as shown in FIG. 5B.

However, in the case of the shape of the magneto-resistance segment 2a according to embodiment 1, the vertical magnetic field becomes larger as a change in the direction of the applied magnetic field. Accordingly, a direction (direction in which the resistance value is increased) in which reduction in the resistance value is cancelled is assumed, so the displacement from the case of accurate disposition is small.

At the same time, in the case of the magneto-resistance segment 2b, the magnitude and direction of the applied magnetic field have reverse effects, so the displacement in the resistance value from the case of accurate disposition is small as in the magneto-resistance segment 2a. As a result, the displacement of the output waveforms of the magneto-resistance segments 2a and 2b becomes smaller.

In Japanese Patent No. 4229877, when the two magneto-resistance segments are displaced relative to the magnet, only the direction of the applied magnetic field is considered and the case in which the magnitude of the applied magnetic field changes is not described. This is different from the present invention.

Figure 10A:
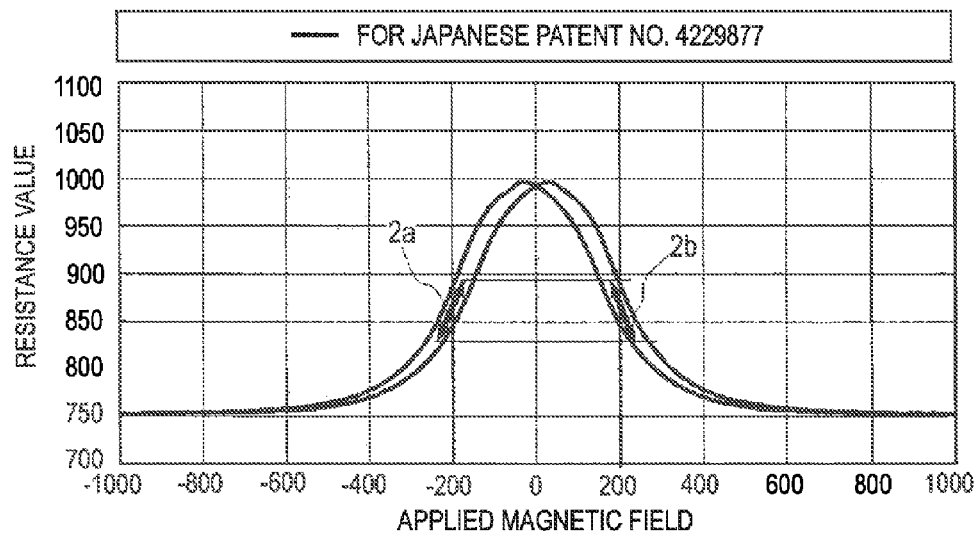
FIGS. 10A and 10B show the relationship between the strength of the magnetic field and the resistance value of the GMR element in Japanese Patent No. 4229877 (see PTL 2).
Figure 10B:
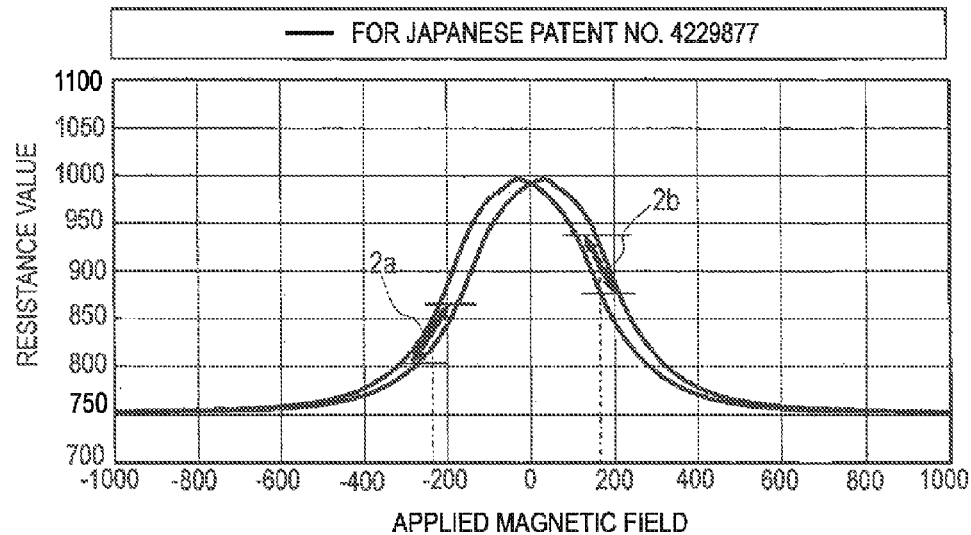

FIGS. 10A and 10B show the relationship between the strength of the magnetic field of the GMR element and the resistance value of the GMR element in the case of Japanese Patent No. 4229877. FIG. 10A shows a case in which the magneto-resistance segments 2a and 2b are accurately disposed relative to the magnet 3 and FIG. 10B shows a case in which the magneto-resistance segments 2a and 2b are displaced relative to the magnet 3. In FIGS. 10A and 10B, the structure of the magneto-resistance segments 2a and 2b has no anisotropy, so there is one graph curve for each Since Japanese Patent No. 4229877 does not consider the case in which the magnitude of the applied magnetic field changes, displacement occurs as shown in FIG. 10B. The present application can solve this problem.

The present invention is not limited to the above embodiment and may be changed, modified, or omitted as appropriate without departing from the scope and spirit of the invention. Various modifications and alternations of this invention will be apparent to those skilled in the art without departing from the scope and spirit of this invention, and it should be understood that this is not limited to the illustrative embodiments set forth herein.

What is claimed is:

1. A magnetic detection apparatus comprising:
   a magnetic moving body having a shape changing a magnetic field, the magnetic moving body rotating in sync with a rotary shaft;
   magneto-resistance elements detecting a change in the magnetic field by the magnetic moving body, the magneto-resistance elements being anisotropic;
   a magnet applying the magnetic field to the magneto-resistance elements; and
   a processing circuit unit having a bridge circuit including the magneto-resistance elements, the processing circuit unit detecting the change in the magnetic field acting on the magneto-resistance elements by converting a change in resistance values of the magneto-resistance elements to a change in voltages,
   wherein the magneto-resistance elements are separately disposed in a rotational direction of the magnetic moving body, and
   a pattern shape of each of the magneto-resistance elements is a zigzag shape having a plurality of turn-back portions oriented at an angle α relative to a direction orthogonal to a direction of the magnetic field applied to cancel a change of the direction and a magnitude of the magnetic field depending on a displacement in the rotational direction of the magneto-resistance elements relative to the magnet.

2. The magnetic detection apparatus according to claim 1, wherein the angle α is optimized by measurement in consideration of an amount of the displacement of the magneto-resistance elements in the rotational direction relative to the magnet.

3. The magnetic detection apparatus according to claim 1, wherein each of the magneto-resistance elements includes a giant magneto-resistance element (GMR element).

4. The magnetic detection apparatus according to claim 1, wherein the magnetic moving body is a gear-shaped magnetic moving body rotating in sync with the rotary shaft.

5. The magnetic detection apparatus according to claim 1, wherein the bridge circuit comprises the magneto-resistance elements and resistors.

6. The magnetic detection apparatus according to claim 1, wherein the magneto-resistance elements are disposed so as to be separated in the rotation direction of the magnetic moving body on the processing circuit unit.

7. The magnetic detection apparatus according to claim 1, wherein the pattern shape of each of the magneto-resistance elements is oriented at the angle α relative to the direction orthogonal to the direction of the magnetic field so as to cancel an amount of a change in a resistance value of a respective one of the magneto-resistance elements caused by the change in the magnitude of the magnetic field caused by changing the direction of the magnetic field applied.

* * * * *